(12) United States Patent
Halle et al.

(10) Patent No.: US 8,053,172 B2
(45) Date of Patent: Nov. 8, 2011

(54) PHOTORESISTS AND METHODS FOR OPTICAL PROXIMITY CORRECTION

(75) Inventors: Scott David Halle, Hopewell Junction, NY (US); Wu-Song Huang, Brewster, NY (US); Ranee Wai-Ling Kwong, Wappingers Falls, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 794 days.

(21) Appl. No.: 12/035,009

(22) Filed: Feb. 21, 2008

(65) Prior Publication Data

US 2009/0214981 A1    Aug. 27, 2009

(51) Int. Cl.
*G03F 7/039* (2006.01)
*G03F 7/20* (2006.01)
*G03F 7/22* (2006.01)
*G03F 7/30* (2006.01)
*G03F 7/38* (2006.01)

(52) U.S. Cl. ........ 430/311; 430/312; 430/325; 430/326; 430/328; 430/329; 430/330; 430/905; 430/907; 430/910; 430/914; 430/270.1

(58) Field of Classification Search .............. None
See application file for complete search history.

(56) References Cited

U.S. PATENT DOCUMENTS 5,290,397 A    3/1994 Ober et al.
2005/0221224 A1*    10/2005 Mizutani .................. 430/270.1
* cited by examiner

*Primary Examiner* — Sin J. Lee
(74) *Attorney, Agent, or Firm* — Schmeiser, Olsen & Watts; Wenjie Li

(57) ABSTRACT

Photolithography compositions and methods. A first layer of a first photoresist is formed on a substrate. A second layer of a second photoresist is formed directly onto the first layer. The second polymer of the second photoresist includes an absorbing moiety. The second layer is patternwise imaged and developed, resulting in removal of base-soluble regions. A relief pattern from the second layer remains. The relief pattern and the first layer are exposed to a second dose of the radiation. The polymer in the relief pattern absorbs a portion of the second dose. A fraction of the second dose passes through the at least one region of the relief pattern and exposes at least one region of the first layer. The relief pattern and base-soluble regions of the first layer are removed. A relief pattern from the first layer remains. A second photolithography method and a photoresist composition are also included.

23 Claims, 7 Drawing Sheets

PHOTORESISTS AND METHODS FOR OPTICAL PROXIMITY CORRECTION

FIELD OF THE INVENTION

The invention generally relates to photoresist compositions and methods of photolithography using the same.

BACKGROUND OF THE INVENTION

Optical proximity correction (OPC) has been used to correct image errors due to diffraction or process effects in the semiconductor industry. One approach is to introduce bias to the features, or insert additional features such as SRAFs or hammerheads; however some of the image errors cannot be resolved by the special features due to space limitations. More complicated OPC requires extensive simulation and modeling and introduces complex arrays of polygons and assist features. Partially transmitting masks and dual masks have also been adopted; however manufacturing such masks is complex and expensive. In addition, it is also very difficult to introduce partially transparent patterns at a specific complex pattern area. There exists a need for compositions and methods for overcoming image errors due to diffraction or process effects.

SUMMARY OF THE INVENTION

The present invention relates to a photolithography method comprising:
  forming a first layer of a first photoresist on a substrate, said first photoresist comprising a first polymer and a first photosensitive acid generator, said first photosensitive acid generator producing acid upon exposure to radiation having a wavelength or range of wavelengths;
  forming a second layer of a second photoresist directly onto said first layer, said second photoresist comprising a second polymer and a second photosensitive acid generator, said second photosensitive acid generator producing acid upon exposure to said radiation, said second polymer comprising an absorbing moiety resulting in said second polymer absorbing said radiation;
  patternwise imaging said second layer through a first mask, resulting in exposing at least one region of said second layer to a first dose of said radiation, resulting in said second photosensitive acid generator producing acid in said exposed at least one region of said second layer;
  developing said second layer in an aqueous base solution, resulting in removal of base-soluble regions of said second layer, wherein a first relief pattern from said second layer remains following said removal;
  exposing said first relief pattern and said first layer to a second dose of said radiation through a second mask, resulting in exposing at least one region of said first relief pattern to said second dose of radiation, said polymer in said first relief pattern absorbing a portion of said second dose of radiation, resulting in a fraction of said second dose of radiation passing through said at least one region of said first relief pattern and exposing at least one region of said first layer to said fraction of said second dose of radiation, resulting in said first photosensitive acid generator producing acid in said exposed at least one region of said first layer; and
  removing said first relief pattern and base-soluble regions of said first layer, wherein a second relief pattern from said first layer remains following said removing.

The present invention relates to a photolithography method comprising:
  forming a first layer of a first photoresist on a substrate, said first photoresist comprising a first polymer and a first photosensitive acid generator, said first photosensitive acid generator producing acid upon exposure to radiation having a wavelength or range of wavelengths;
  forming a second layer of a second photoresist directly onto said first layer, said second photoresist comprising a second polymer and a second photosensitive acid generator, said second polymer comprising at least one absorbing moiety, each absorbing moiety absorbing radiation having said wavelength or range of wavelengths, said absorbing moiety cleavable from said polymer upon thermal treatment in the presence of acid, said second photosensitive acid generator producing acid upon exposure to said radiation;
  patternwise imaging said second layer through a first mask, resulting in exposing at least one region of said second layer to a first dose of said radiation, resulting in said second photosensitive acid generator producing acid in said exposed at least one region of said second layer, wherein at least one area of said second layer is not exposed to said first dose of said radiation;
  after said imaging, thermally treating said second layer at a first temperature, resulting in cleaving absorbing moieties from said polymer in said exposed at least one region of said second layer;
  after said thermally treating, exposing said second layer and said first layer to a second dose of said radiation through a second mask, said radiation passing through said exposed at least one region of said second layer resulting in exposing a first region of said first layer directly beneath said exposed at least one region of said second layer to a first fraction of said second dose of radiation, said radiation passing through said at least one area of said second layer resulting in exposing a second region of said first layer directly beneath said at least one area of said second layer to a second fraction of said second dose of radiation, resulting in said first photosensitive acid generator producing acid in said first region of said first layer and in said second region of said first layer; and
  removing said second layer and base-soluble regions of said first layer, wherein a relief pattern from said first layer remains following said removing.

A photoresist composition, comprising:
  at least one polymer having at least one absorbing moiety, said polymer substantially soluble in aqueous base developer, said absorbing moiety cleavable from said polymer upon thermal treatment in the presence of acid;
  a photosensitive acid generator, said first photosensitive acid generator producing acid upon exposure to radiation having a wavelength or range of wavelengths; and
  a solvent.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
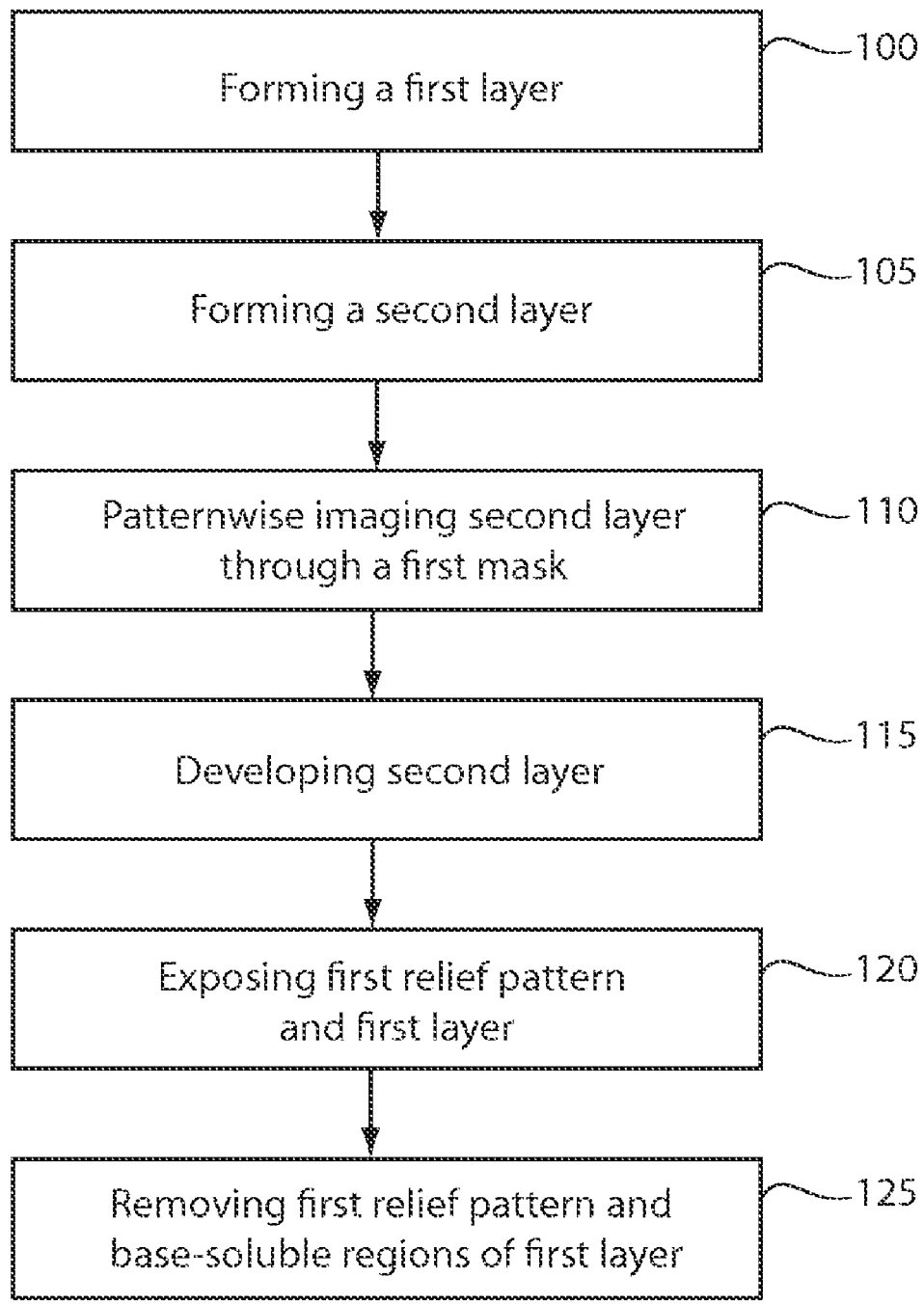
FIG. 1 is a flow chart illustrating a photolithography method, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

Described herein are photolithographic methods and compositions relating to a first photoresist layer formed on a substrate and a second photoresist layer formed directly onto the first layer, where the second layer may function as a masking layer and absorb a portion of radiation exposed to the substrate and layers thereon and reduce the exposure to the underlying first photoresist layer.

The second layer (masking layer) may have an absorption parameter (k) greater than that of the underlying first photoresist layer at the imaging wavelength of the underlying photoresist. The absorption parameter k indicates the amount of absorption loss when an electromagnetic wave propagates through a material, such as a photoresist. The k parameter of the second layer may be in the range from about 0.05 to about 0.8, such as in the range from about 0.08 to about 0.5 at the imaging wavelength of the underlying photoresist.

The photosensitive acid generators (PAG) described herein are capable of producing or generating an amount of acid (such as 1 mole of acid per mole of PAG, for example) upon exposure to a dose of electromagnetic radiation, such as visible, ultraviolet (UV) and extreme ultraviolet (EUV), for example. The PAG may comprise, for example, triphenyl sulfonium nonaflate (TPSN), (trifluoro-methylsulfonyloxy)-bicyclo[2.2.1]hept-5-ene-2,3-dicarboximide (MDT), N-hydroxy-naphthalimide dodecane sulfonate (DDSN), onium salts, aromatic diazonium salts, sulfonium salts, diaryliodonium salts, sulfonic acid esters of N-hydroxyamides, imides, or combinations thereof.

The layers described herein may be formed by a process such as spin coating, spray coating, dip coating, doctor-blading, roll coating, and the like, which may be used individually or in one or more combination thereof in accordance with the methods of the present invention. The layers may be baked following forming (post-applying baked, PAB) to remove any solvent from the layer and improve the coherence of the layer. The temperature of the PAB may be in a range from about 70° C. to about 150° C., such as from about 90° C. to about 130° C.

The term substantially insoluble, as used herein, is intended to comprise having such a small degree of solubility so as to not affect the quality of an image formed from a photoresist by loss of material (e.g. polymer, photoresist, etc.) through dissolution into aqueous base solution or photoresist solvents from regions of the photoresist layer not containing photosensitive acid generator derived acid. The term substantially soluble, as used herein, is intended to comprise having a high enough degree of solubility in aqueous base solutions or solvents so to allow all or almost all (i.e., any remaining material is present such a small amounts so as to not interfere with subsequent processing steps) of the material (e.g. polymer, photoresist, etc.) in regions containing acid derived from the photosensitive acid generator to dissolve into aqueous base solutions or photoresist solvents. In the context of photoresist formulation and semiconductor processing the term substantially insoluble is intended to include polymers completely or almost completely insoluble in photoresist solvents. In the context of photoresist formulation and semiconductor processing the term substantially soluble is intended to include polymers completely or almost completely soluble in photoresist solvents. In general, the polymer dissolution rates affect the dissolution rates of the photoresist layers most strongly, thus a substantially insoluble polymer may render substantially insoluble a photoresist comprising that polymer. Substantially insoluble photoresists have a dissolution rate of less than about 0.2 nanometers/second (nm/s) in solvent or aqueous base, while substantially soluble photoresists have a dissolution rate of greater than about 5 nm/s in solvent or aqueous base. Photosensitive acid generators, quencher and other additives may also alter the dissolution rates of the final photoresist layer.

The substrates described herein may include a semiconducting material, an insulating material, a conductive material or any combination thereof, including multilayered structures. Thus, for example, the substrate may comprise a semiconducting material such as Si, SiGe, SiGeC, SiC, GaAs, InAs, InP and other III/V or II/VI compound semiconductors. The substrate may comprise, for example, a silicon wafer or process wafer such as that produced in various steps of a semiconductor manufacturing process, such as an integrated semiconductor wafer. The substrate may comprise a layered substrate such as, for example, Si/SiGe, Si/SiC, silicon-oninsulators (SOIs) or silicon germanium-on-insulators (SGOIs). The substrate may comprise layers such as a dielectric layer, a barrier layer for copper such as SiC, a metal layer such as copper, a silicon layer, a silicon oxide layer, the like, or combinations thereof. The substrate may comprise an insulating material such as an organic insulator, an inorganic insulator or a combination thereof including multilayers. The substrate may comprise a conductive material, for example, polycrystalline silicon (polySi), an elemental metal, alloys of elemental metals, a metal silicide, a metal nitride, or combinations thereof, including multilayers. The substrate may comprise ion implanted areas, such as ion implanted source/drain areas having P-type or N-type diffusions active to the surface of the substrate.

In some embodiments, the substrate may include a combination of a semiconducting material and an insulating material, a combination of a semiconducting material and a conductive material or a combination of a semiconducting material, an insulating material and a conductive material. An example of a substrate that includes a combination of the above is an interconnect structure.

The photoresists described herein may further comprise one or more surfactants. Surfactants may be used to improve coating uniformity, and may include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Union Carbide Corporation in Danbury, Conn.

The photoresists described herein may include a casting solvent to dissolve the other components, so that the photoresist may be applied evenly on the substrate surface to provide a defect-free coating. Where the photoresist is used in a multilayer imaging process, the solvent used in the imaging layer may not be a solvent to the underlayer materials, otherwise unwanted intermixing may occur. Some examples of suitable casting solvents include ethers, glycol ethers, aromatic hydrocarbons, ketones, esters, ethyl lactate, gamma-butyrolactone (GBL), cyclohexanone, ethoxyethylpropionate (EEP), a combination of EEP and GBL, and propylene glycol methyl ether acetate (PGMEA). The present invention is not limited to the selection of any particular solvent.

The photoresists described herein may include a base quencher, sensitizers or other expedients known in the art. The compositions of the photoresists described herein are not limited to any specific selection of these expedients, where base quenchers may comprise aliphatic amines, aromatic amines, carboxylates, hydroxides, or combinations thereof. For example base quenchers may include: dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines such as in the PLURONIC or TETRONIC series commercially available from BASF. Tetra alkyl ammonium hydroxides or cetyltrimethyl ammonium hydroxide may be used as a base quencher when the PAG is an onium salt.

The photoresists described herein are not limited to any specific proportions of the various components. The photoresist may comprise about 1% by weight (wt %) to about 30 wt % of polymer based on the total weight of the composition, such as from about 2 wt % to about 15 wt %. The photoresist composition may comprise from about 0.5 wt % to about 30 wt % photosensitive acid generator based on the weight of the polymer in the composition, such as from about 0.5 wt % to about 20 wt %. The photoresist composition may comprise from about 70 wt % to about 99 wt. % solvent based on the total weight of the composition, such as from about 85 wt % to about 98 wt %. The photoresist composition may further include about 0.1 wt % to about 1.0 wt % of base quencher based on the total weight of the polymer in the composition. The photoresist composition may further include about 0.001 wt % to about 0.1 wt % of surfactant based on the total weight of polymer in the composition.

Radiation as described herein, such as for patternwise imaging and/or exposure of photoresists, may comprise electromagnetic radiation, such as ultraviolet (UV) light having wavelengths such as approximately 436 nanometers (nm) and 365 nm, deep-ultraviolet (DUV) light having wavelengths such as approximately 257 nm, 248 nm, 193 nm, and 157 nm, extreme-ultraviolet (EUV) light having wavelengths such as approximately 4 nm to approximately 70 nm (such as approximately 13 nm, x-rays, combinations of these, and the like. Various wavelengths of radiation may be used such as 313 nm, 334 nm, 405 nm, and 126 nm etc., where the sources may be mainly from specific mercury emission lines or specific lasers. For high performance lithography, single wavelength and/or narrow band radiation sources may be used. For less stringent conditions, a broad band multiple wavelength source may be used. The photoresist compositions of the present invention may be patternwise imaged using particle beams such as electron beam, ion beam, combinations of these, and the like. The appropriate radiation or particle beam type(s) may depend on the components of the overall photoresist composition (e.g., the selection of polymer, photosensitive acid generator (PAG), base (or quencher), surfactant, solvent, etc.).

FIG. 1 is a flow chart illustrating a photolithography method. Step 100 comprises forming a first layer of a first photoresist on a substrate. The first photoresist may comprise a first polymer and a first photosensitive acid generator. The first photosensitive acid generator may produce acid upon exposure to radiation having a wavelength or range of wavelengths. The thickness of the first photoresist layer may be in a range from about 20 nanometers (nm) to about 400 nm, such as from about 50 nm to about 300 nm.

The polymer of the first photoresist described above may comprise any polymer suitable for chemically amplified photoresists. The polymer may have a structure comprising at least one acid labile group or at least one base soluble group. For example, a polymer in a positive tone chemically amplified system may comprise at least one repeating unit having at least one acid labile group which can be deprotected in an acid-catalyzed thermal baking process making the polymer substantially soluble in base developers. In some embodiments, the polymer of the photoresist may comprise at least one hydroxyl group, where the at least one hydroxyl group is protected by conversion to a methoxycyclohexyl group (MOCH). In some embodiments, the polymer of the photoresist may comprise repeating units having at least one acid labile group selected from tertiary esters of methyladamantane, ethyladamantane, methylcyclopentane, ethylcyclopentane, methylcyohexane, ethylcyohexane, methylcycloheptane, ethylcyclohepatane, methylcyclooctane, ethylcyclooctane, and t-butyl groups.

In another example, a polymer in a negative tone chemically amplified system may comprise at least one repeating unit having at least one base soluble group which may allow the polymer to be substantially soluble in base developers. The polymer may be configured to crosslink or undergo a polarity change in an acid-catalyzed thermal baking process, thus making the polymer substantially insoluble in base developers. The polymer may comprise a homopolymer, a copolymer, a terpolymer, a tetrapolymer, etc. The polymer may comprise a polymer blend of two or more polymers.

Step 105 comprises forming a second layer of a second photoresist directly onto the first layer. The second photoresist may comprise a second polymer and a second photosensitive acid generator, where the second photosensitive acid generator produces acid upon exposure to the radiation. The thickness of the second layer may be in a range from about 10 nm to about 200 nm, such as from about 20 nm to about 120 nm. The second polymer comprises an absorbing moiety, resulting in the second polymer absorbing the radiation, or a portion thereof, to which the polymer may be exposed. The absorbing moiety is not cleavable from the polymer structure via acid-catalyzed bond cleavage. Examples of suitable absorbing moieties include unsubstituted aromatic moieties and substituted aromatic moieties. For example, the absorbing moiety may comprise benzene, naphthalene, hydroxy-substituted benzene, and hydroxy-substituted naphthalene groups. Examples of the polymer of the second photoresist layer include polymers containing polycyclic moieties commonly used in 193 nanometer (nm) photoresists and phenol groups commonly used in 248 nm photoresists. An example of the second polymer includes:

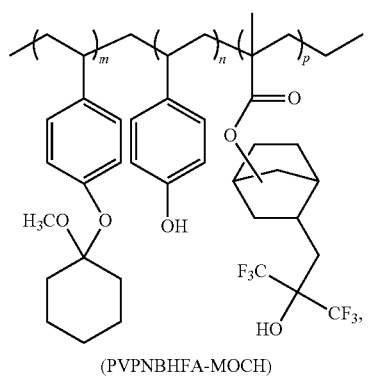

(PVPNBHFA-MOCH)

where m, n, and p are integers representing the number of repeating units, each independently ranging between 1 and about 50,000.

Step 110 comprises patternwise imaging the second layer through a first mask, using a radiation or particle beam source, resulting in exposing at least one region of the second layer to a first dose of the radiation, resulting in the second photosensitive acid generator producing acid in the exposed at least one region of the second layer. The first dose of radiation may be in a range from about 1 millijoules/centimeter$^2$ (mj/cm$^2$) to about 10 mj/cm$^2$.

Step 115 comprises developing the second layer in an aqueous base solution, resulting in removal of base-soluble regions of the second layer, wherein a first relief pattern from the second layer remains following the removal of the base-soluble regions. The photoresist of the second layer may be either a positive-tone resist or a negative-tone resist. When the photoresist of the second layer is a positive-tone resist, the exposed regions of the second layer are dissolved in the aqueous base solution, and the relief pattern comprises unexposed regions of the second layer remaining following removal of base-soluble exposed regions of the second layer. When the photoresist of the second layer is a negative-tone resist, the unexposed regions of the second layer are dissolved in the aqueous base solution, and the relief pattern comprises exposed regions of the second layer remaining following removal of base-soluble exposed regions of the second layer.

After imaging and before developing the second layer of the second photoresist, the second layer may be baked at a first temperature, resulting in the exposed at least one region of said second layer becoming substantially soluble in aqueous base. For a chemically amplified resist system, baking after patternwise imaging may deprotect acid labile groups in the polymer, regenerating base soluble groups through an acid catalyzed amplification process, thus the baking may render the exposed regions of the resist substantially soluble in a developer, such as aqueous base. The first temperature may be in a range from about 70° C. to about 140° C., such as between about 90° C. and about 130° C.

Step 120 comprises exposing the first relief pattern and the first layer to a second dose of the radiation through a second mask, resulting in exposing at least one region of the relief pattern to the second dose of radiation, the polymer in the relief pattern absorbing a portion of the second dose of radiation, resulting in a fraction of the second dose of radiation passing through the at least one region of the relief pattern and exposing at least one region of the first layer to the fraction of the second dose of radiation, resulting in the first photosensitive acid generator producing acid in the exposed at least one region of the first layer. The absorbing moiety of the second polymer may cause the second photoresist to absorb a portion of the radiation as the radiation through the remaining portions of the second layer forming the relief pattern to the portion of the first layer directly below the relief pattern, thus the portion of the first layer directly below the relief pattern is exposed to a reduced amount of radiation, or a fraction of the dose of radiation in the second dose. The second dose may be in a range from about 12 mj/cm$^2$ to about 80 mj/cm$^2$. The fraction of the second dose of radiation exposed to the first layer directly beneath relief pattern may be between about 0.15 and about 0.90.

Exposure of the relief pattern to the second dose of radiation may result in the production of acid by the second PAG in areas of the relief pattern exposed to the second dose of radiation, rendering those exposed areas soluble in aqueous base developer.

The photolithographic masks described herein may each comprise a pattern of masked sections, which are essentially opaque to the radiation or impenetrable to the energetic particles, and unmasked sections which are essentially transparent to the radiation or penetrable to the energetic particles. The second mask and said first mask may be the same or different, where they may have the same pattern or different pattern, respectively, of masked and unmasked sections. In embodiments where the second mask and the first mask are different, exposing the relief pattern and the first layer may comprise exposing portions of the first layer directly beneath portions of the relief pattern where unexposed regions of the second layer remain, and exposing portions of the first layer directly from over which exposed regions of the second layer have been removed. In embodiments where the second mask and the first mask are the same, the dose of second dose of radiation which directly exposes the first layer may not be reduced, such that directly exposed areas of the first layer may receive the full second dose of radiation.

Step 125 comprises removing the first relief pattern and base-soluble regions of the first layer, wherein a second relief pattern from the first layer remains following the removing. The second relief pattern may comprise unexposed regions of the first layer remaining after the removing. Removing the first relief pattern and the base-soluble regions of the first layer may comprise developing the first relief pattern and base-soluble portions of the first layer in an aqueous base solution, where the first relief pattern and the base-soluble portions of the first layer are dissolved in the aqueous base developer.

After exposing the first relief pattern and the first layer and before removing the first relief pattern and base-soluble regions of the first layer, the first layer and first relief pattern may be baked at a second temperature, resulting in the exposed at least one region of said first layer and the first relief image becoming substantially soluble in aqueous base. Baking, after exposing the first relief pattern and the first layer, may deprotect acid labile groups in the polymer in the first relief pattern, and deprotect acid labile groups in exposed regions of the first layer, regenerating base soluble groups through an acid catalyzed amplification process, thus the baking may render the first relief pattern and the exposed regions of the first layer substantially soluble in a developer, such as aqueous base. In some instances, it is possible to avoid the baking step since for certain chemistries, such as acetal and ketal chemistries, deprotection may proceed at room temperature. The second temperature may be in a range from about 70° C. to about 140° C., and may be higher than the first temperature.

Figure 2A:
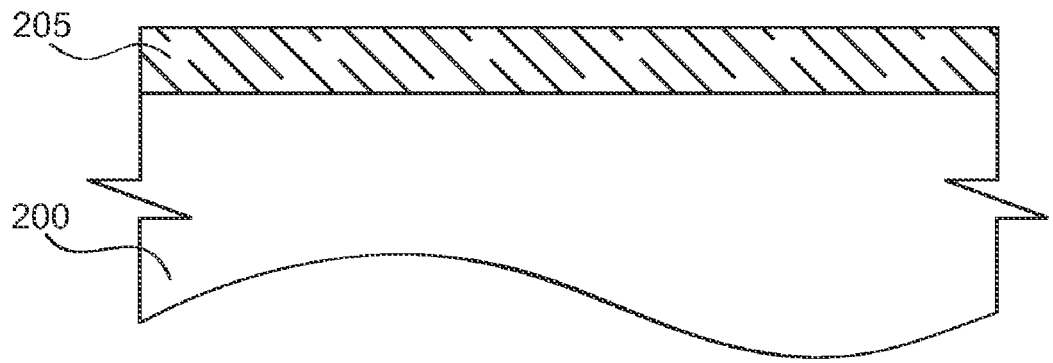
FIG. 2A is an illustration of a substrate after a first layer of a first photoresist has been formed thereon, in accordance with embodiments of the present invention.
Figure 2B:
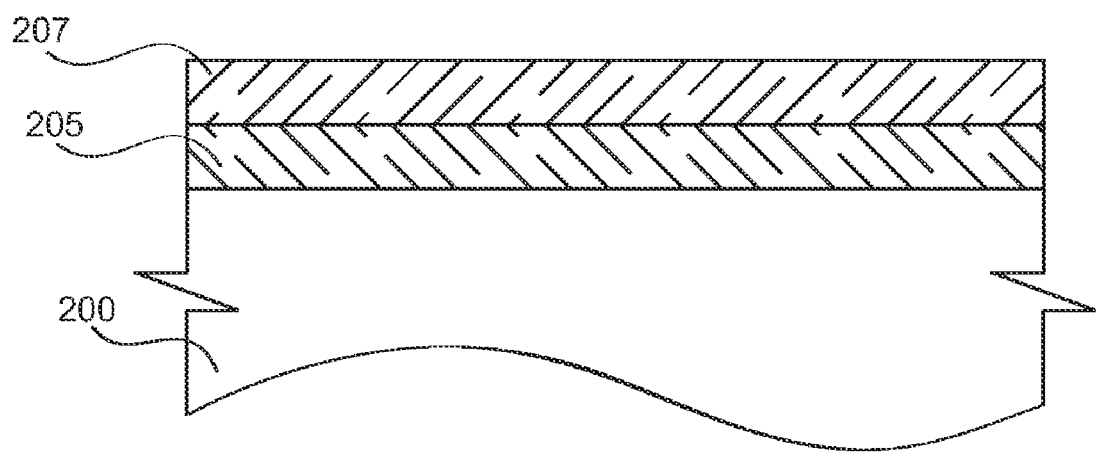
FIG. 2B is an illustration of the substrate of FIG. 1 after a second layer of a second photoresist has been formed directly onto the first layer of the first photoresist, in accordance with embodiments of the present invention.

FIG. 2A is an illustration of a substrate 200 after a first layer of a first photoresist 205 has been formed thereon. The first photoresist may comprise a first polymer and a first photosensitive acid generator, such as those described above for step 100 of FIG. 1. FIG. 2B is an illustration of the substrate 200 of FIG. 1 after a second layer of a second photoresist 207 has been formed directly onto the first layer of the first photoresist 205. The second photoresist may comprise a second polymer and a second photosensitive acid generator, where the second polymer comprises an absorbing moiety, such as described above for step 105 of FIG. 1.

Figure 2C:
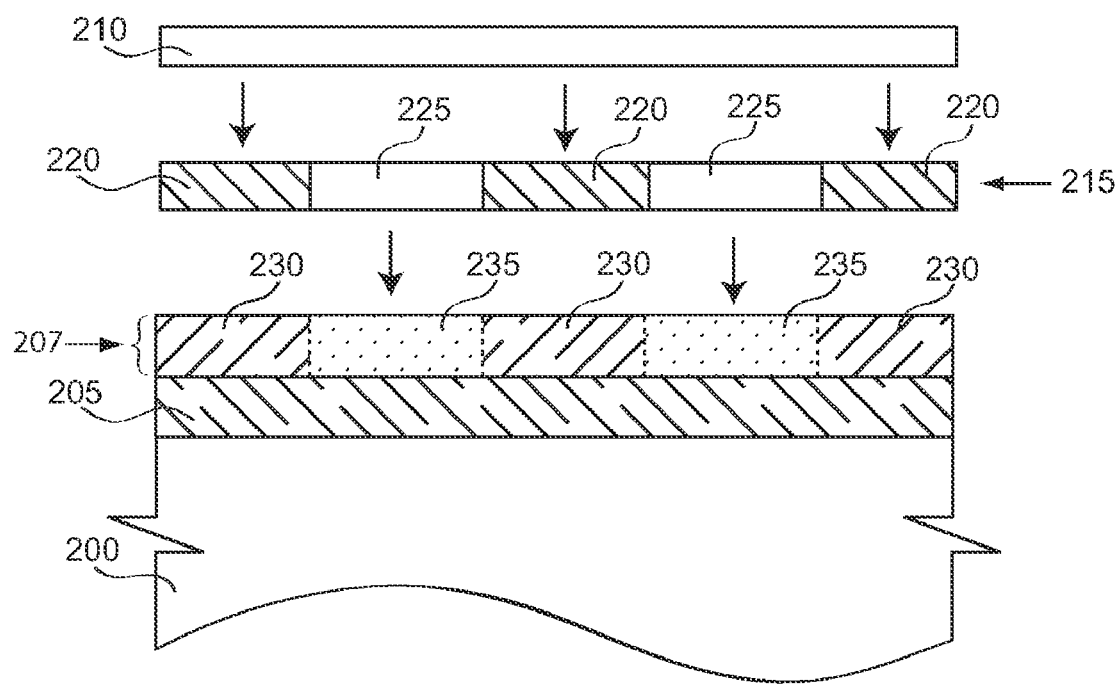
FIG. 2C is an illustration of patternwise imaging the second layer of FIG. 2B, in accordance with embodiments of the present invention.

FIG. 2C is an illustration of patternwise imaging the second layer 207 of FIG. 2B through a first mask 215, resulting in exposing at least one region 235 of said second layer 207 to a first dose of radiation, resulting in the second photosensitive acid generator producing acid in the exposed at least one region 235 of the second layer 207. A radiation or particle beam source 210 may project radiation or energetic particles through the first patterned mask 215 onto the second layer 207. The first patterned mask 215 may have a pattern of masked sections 220 which are essentially opaque to the radiation or impenetrable to the energetic particles, and unmasked sections 225 which are essentially transparent to the radiation or penetrable to the energetic particles. Radiation or particles passing through the unmasked sections 225 may be transmitted to the second layer 207 to be absorbed in the exposed regions 235 of the second layer 207, wherein the radiation or particles may induce the production of an acid catalyst in the exposed regions 235 of the second layer 207. Unexposed regions 230 of second layer 207 may not produce an acid catalyst. Exposure to the radiation or energetic particles may render the exposed regions 235 soluble in a developer.

Figure 2D:
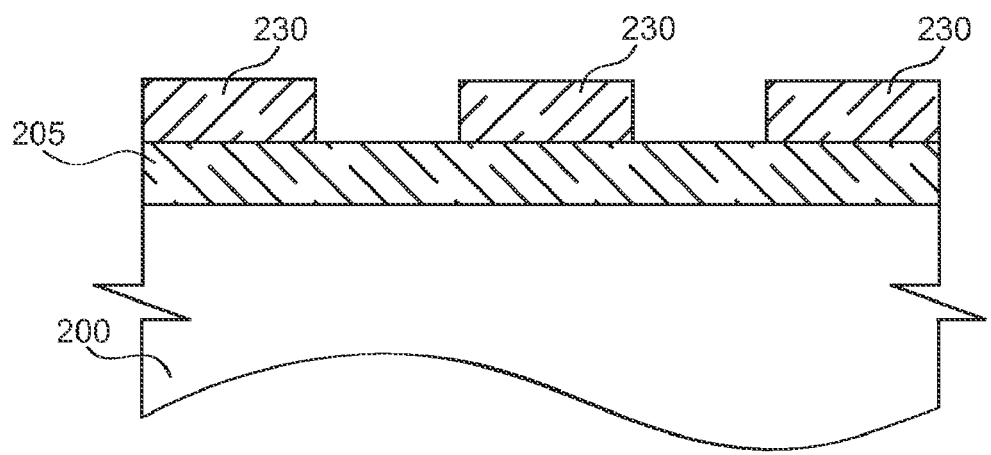
FIG. 2D is an illustration of the substrate and layers of FIG. 2C after developing the second layer, in accordance with embodiments of the present invention.

FIG. 2D is an illustration of the substrate and layers of FIG. 2C after developing the second layer 207 in an aqueous base solution, resulting in removal of base-soluble regions of the second layer 207, wherein a first relief pattern 230 from the second layer 207 remains following the removal. The developer may be organic or aqueous based, such as an aqueous base developer such as tetramethylammonium hydroxide (TMAH) aqueous solution, for example.

Figure 2E:
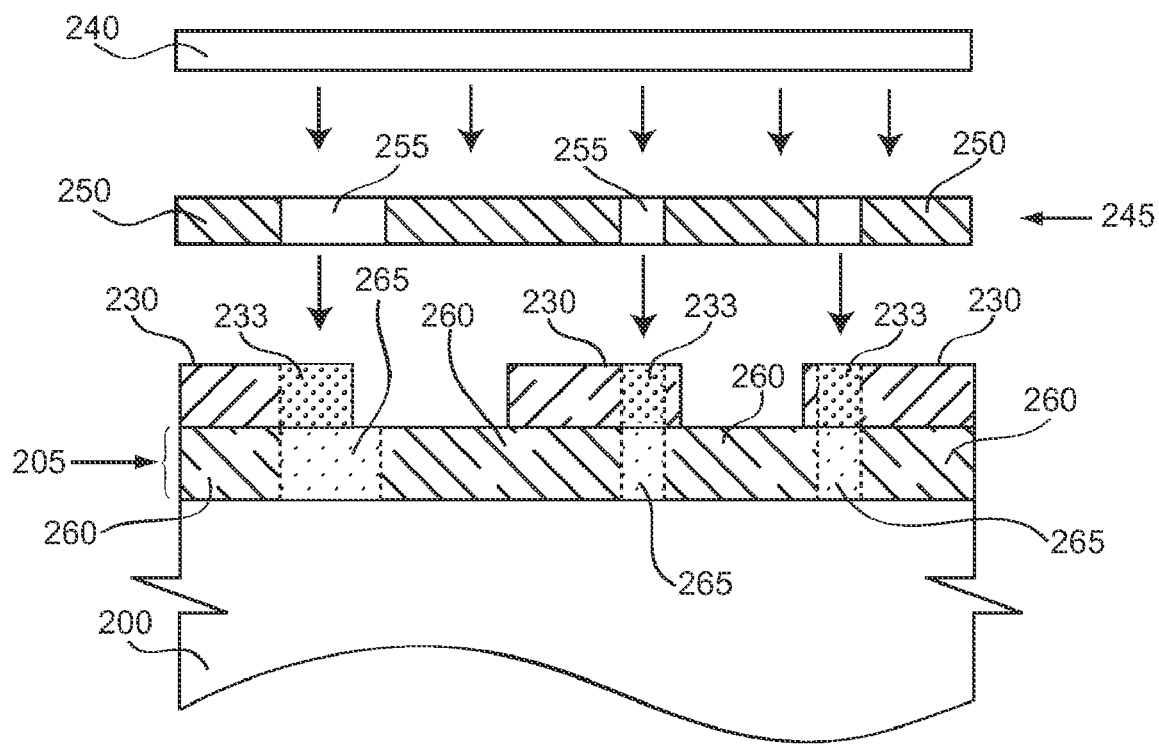
FIG. 2E is an illustration of exposing the first relief pattern and the first layer of FIG. 2D, in accordance with embodiments of the present invention.

FIG. 2E is an illustration of exposing the first relief pattern 230 and the first layer 205 of FIG. 2D to a second dose of radiation through a second mask 245, resulting in exposing at least one region 233 of the relief pattern 230 to the second dose of radiation. The second mask 245 may be different from the first mask 215 in FIG. 2C. The second mask 245 may have a pattern of masked sections 250 which are essentially opaque to the radiation or impenetrable to the energetic particles, and unmasked sections 255 which are essentially transparent to the radiation or penetrable to the energetic particles. The first dose of said radiation may be lower than the second dose of said radiation. The polymer in the exposed at least one region 233 of the relief pattern 230 absorbs a portion of the second dose of radiation due to the presence of an absorbing moiety in the polymer of the relief pattern 230. The absorbing of the portion of the second dose of radiation results in a fraction of the second dose of radiation passing through the at least one region 233 of the relief pattern 230 and exposing at least one region 265 of the first layer 205 to the fraction of the second dose of radiation, resulting in the first photosensitive acid generator producing acid in the exposed at least one region 265 of said first layer 205. The fraction of the second dose of radiation may be between about 0.15 and about 0.90.

Figure 2F:
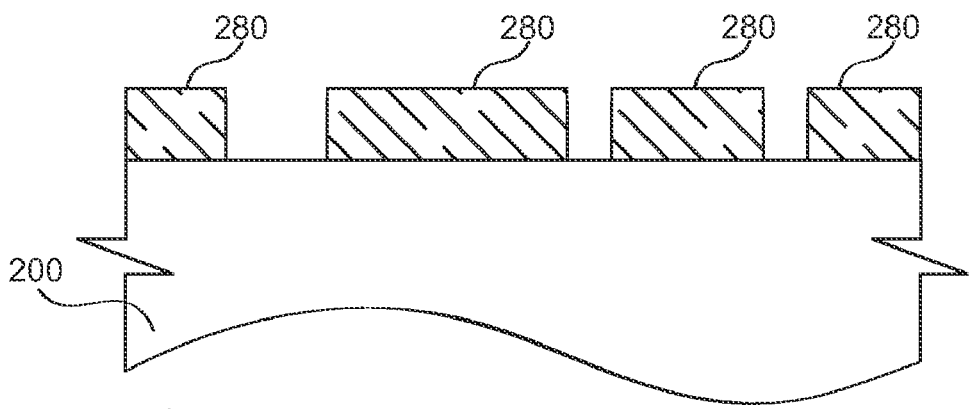
FIG. 2F is an illustration of the substrate and layers of FIG. 2E after removing the first relief pattern and base-soluble regions of the first layer, in accordance with embodiments of the present invention.

FIG. 2F is an illustration of the substrate and layers of FIG. 2E after removing the first relief pattern and base-soluble regions of the first layer, wherein a second relief pattern 280 from the first layer 205 remains following the removing. Base-soluble regions of the first layer may comprise the exposed at least one region 265 of the first layer 205 as shown in the example of FIG. 2E. In other embodiments, such as where the first photoresist is a negative tone resist, base-soluble regions may comprise unexposed regions 260 of the first layer 205, which may be removed following exposure to radiation.

Figure 3:
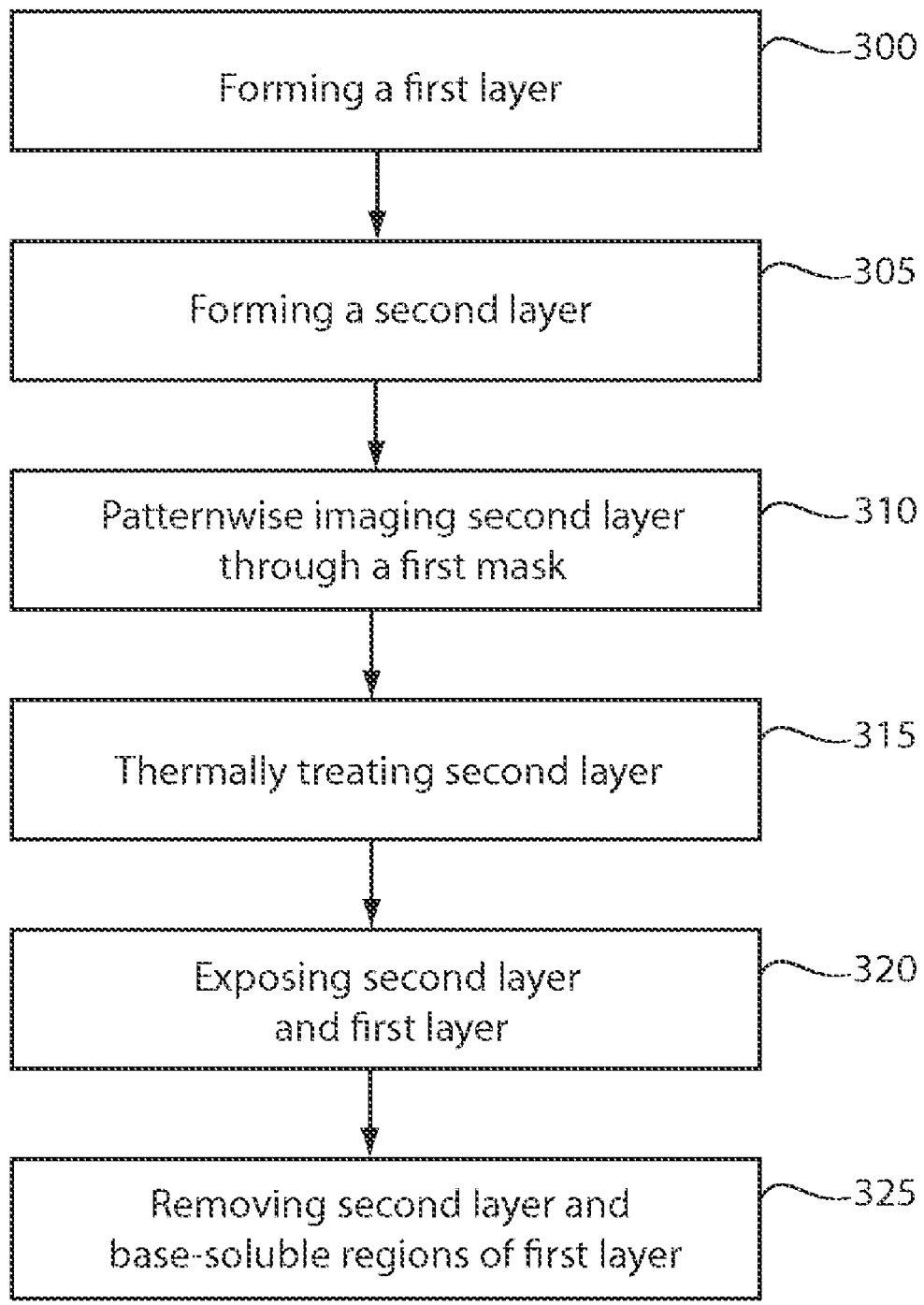
FIG. 3 is a flow chart illustrating a photolithography method, in accordance with embodiments of the present invention.

FIG. 3 is a flow chart illustrating a photolithography method. Step 300 comprises forming a first layer of a first photoresist on a substrate, such as described above for Step 100 of FIG. 1. The first photoresist may comprise a first polymer and a first photosensitive acid generator. The first photosensitive acid generator may produce acid upon exposure to radiation having a wavelength or range of wavelengths, as described above.

Step 305 comprises forming a second layer of a second photoresist directly onto the first layer. The second photoresist comprises a second polymer and a second photosensitive acid generator, where the second polymer comprises at least one absorbing moiety which is cleavable from the polymer upon thermal treatment in the presence of acid. The second photosensitive acid generator produces acid upon exposure to the radiation having a wavelength or range of wavelengths. The absorbing moiety may be linked to the polymer backbone via an acid-cleavable linkage. Example of absorbing moieties include unsubstituted aromatic moieties and substituted aromatic moieties. For example, the absorbing moiety may comprise benzene, naphthalene, hydroxy-substituted benzene, or hydroxy-substituted naphthalene groups. Examples of acid-cleavable linkages include groups such as tertiary esters, tertiary carbonates, tertiary ethers, acetals, ketals, the like, and combinations of these. For example, in at least one embodiment, the polymer structure comprises repeating units containing the absorbing moiety, where the repeating unit comprises:

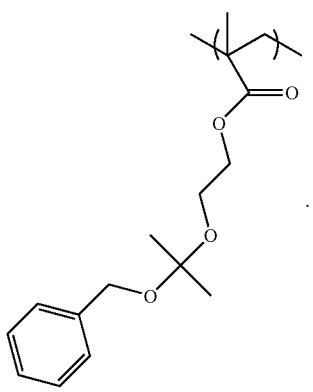

In some embodiments, the second polymer is substantially soluble in aqueous base developer and remains substantially soluble even after the thermal treatment and after the exposure to the radiation, resulting in the second photoresist remaining substantially soluble in aqueous base developer. For such a composition, no relief patterns may be developed, in contrast with photoresists which can be patternwise exposed and then developed to form relief images.

The second polymer may further comprise at least one base soluble moiety, such as alcohol, fluoroalcohol, phenol, naphthol, sulfonamide, fluorosulfonamide, dicarboxyimides, N-hydroxy dicarboxyimide, carboxylic acid, amino group, imino group, the like, and combinations thereof. For example, the second polymer may comprise:

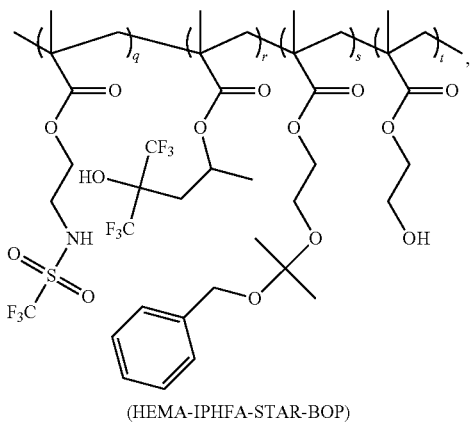

(HEMA-IPHFA-STAR-BOP)

where q, r, s, and t are integers representing the number of repeating units, each independently ranging between 1 and about 50,000.

Step 310 comprises patternwise imaging the second layer through a first mask, resulting in exposing at least one region of the second layer to a first dose of the radiation at a wavelength or range of wavelengths which the absorbing moiety absorbs, resulting in the second photosensitive acid generator producing acid in the exposed at least one region of the second layer. At least one area of the second layer may not be exposed to the radiation.

Step 315 comprises thermally treating the second layer at a first temperature after the imaging of step 310, resulting in cleaving absorbing moieties from the polymer in the exposed at least one region of the second layer, resulting in reducing the absorption of the at least one region of the second layer at the exposure wavelength. For example, the reduction may be between about 5% and about 99% of the original absorbance of the second layer.

Step 320 comprises exposing the second layer and the first layer to a second dose of the radiation through a second mask after thermally treating in step 315. The radiation may pass through the exposed at least one region of the second layer resulting in exposing a first region of the first layer, directly beneath the exposed at least one region of the second layer, to a first fraction of the second dose of radiation. The radiation dose is reduced by a partial absorbance of the radiation by the exposed at least one region of the second layer, thus a fraction of the second dose reaches the first region of the first layer. The radiation may pass through at least one area of the second layer which was not previously exposed to radiation in step 310, resulting in exposing a second region of the first layer directly beneath the at least one area of the second layer to a second fraction of the second dose of the radiation. The radiation dose is reduced due to a partial absorbance of the radiation by the at least one area of the second layer, thus a fraction of the second dose reaches the second region of the first layer. Exposing the second layer and the first layer to a second dose of the radiation, results in the first photosensitive acid generator producing acid in the first region of the first layer and in the second region of the first layer. Since the exposed at least one region of the second layer has a reduced absorbance due to acid-catalyzed bond cleavage of the acid-cleavable absorbing moieties, the fraction of radiation exposing the first region of the first layer is higher than the fraction of radiation exposing the second region of the first layer. For example, the first fraction may be in a range between about 0.30 and about 0.99, and the second fraction may be in a range between about 0.15 and about 0.90.

Step 325 comprises removing the second layer and base-soluble regions of the first layer, wherein a relief pattern from the first layer remains following the removing. The relief pattern may comprise unexposed regions of the first layer remaining after the removing. Removing the second layer and the base-soluble regions of the first layer may comprise developing the second layer and base-soluble portions of the first layer in an aqueous base solution, where the second layer and the base-soluble portions of the first layer are dissolved in the aqueous base developer.

Figure 4A:
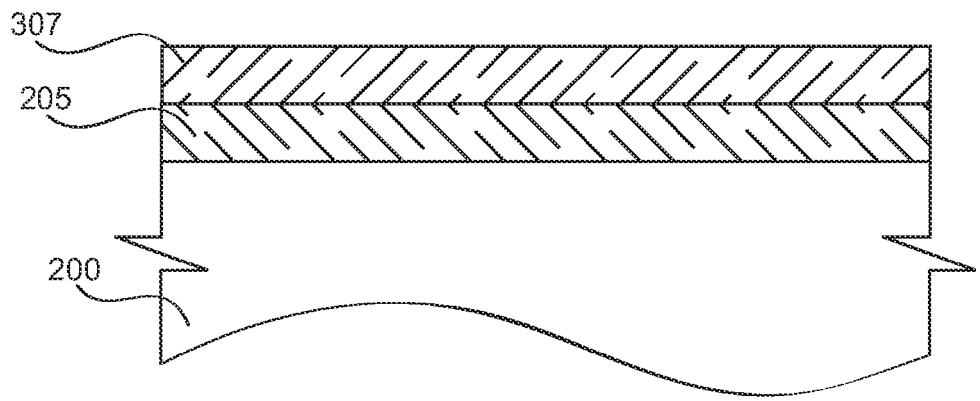
FIG. 4A is an illustration of the substrate and first photoresist layer of FIG. 2A after forming a second photoresist layer directly onto the first photoresist layer, in accordance with embodiments of the present invention.

FIG. 4A is an illustration of the substrate and first photoresist layer 205 of FIG. 2A after forming a second photoresist layer 307 directly onto the first photoresist layer. The second photoresist layer of FIG. 4A comprises a second polymer and a second photosensitive acid generator, where the second polymer comprises at least one absorbing moiety which is cleavable from the polymer upon thermal treatment in the presence of acid, such as described above for step 305 of FIG. 3.

Figure 4B:
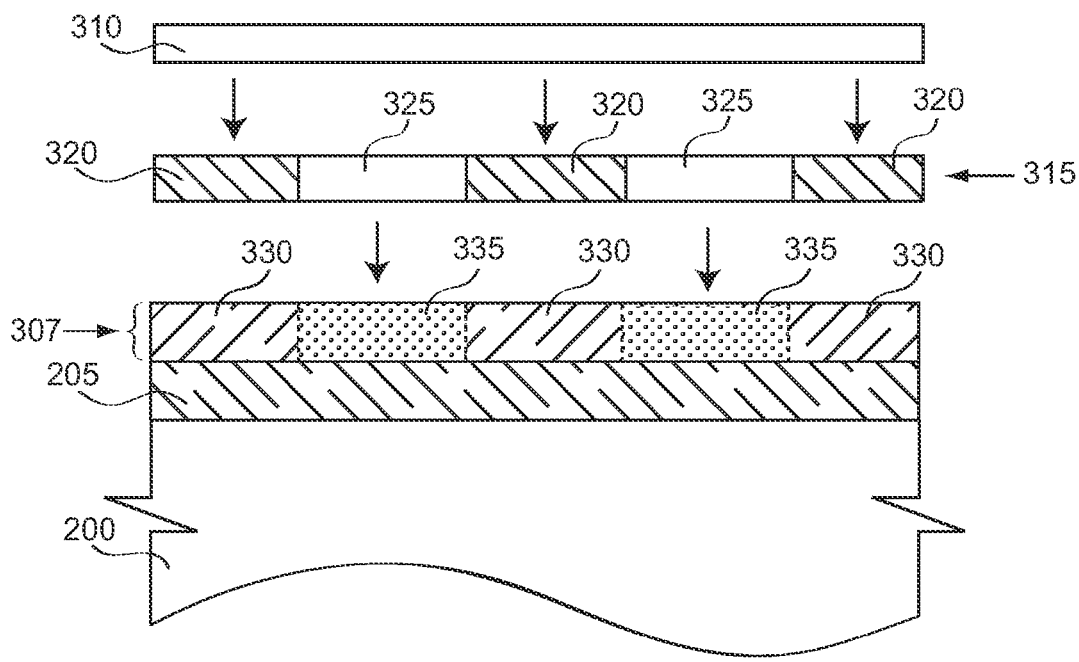
FIG. 4B is an illustration of patternwise imaging the second layer of FIG. 4A, in accordance with embodiments of the present invention.

FIG. 4B is an illustration of patternwise imaging the second layer 307 of FIG. 4A through a first mask 315, resulting in exposing at least one region 335 of the second layer 307 to a first dose of radiation, resulting in the second photosensitive acid generator producing acid in the exposed at least one region 335 of the second layer 307. A radiation or particle beam source 310 may project radiation or energetic particles through the first patterned mask 315 onto the second layer 307. The first patterned mask 315 may have a pattern of masked sections 320 which are essentially opaque to the radiation or impenetrable to the energetic particles, and unmasked sections 325 which are essentially transparent to the radiation or penetrable to the energetic particles. Radiation or particles passing through the unmasked sections 325 may be transmitted to the second layer 307 to be absorbed in the exposed regions 335 of the second layer 307, wherein the radiation or particles may induce the production of an acid catalyst in the exposed regions 335 of the second layer 307. Unexposed areas 330 of second layer 307 may not produce an acid catalyst. Thermally treating the second layer 307 at a first temperature after the imaging, results in cleaving absorbing moieties from the polymer in the exposed at least one region 335 of the second layer 307, resulting in reducing the absorption of the at least one region 335 of the second layer 307 at the exposure wavelength.

Figure 4C:
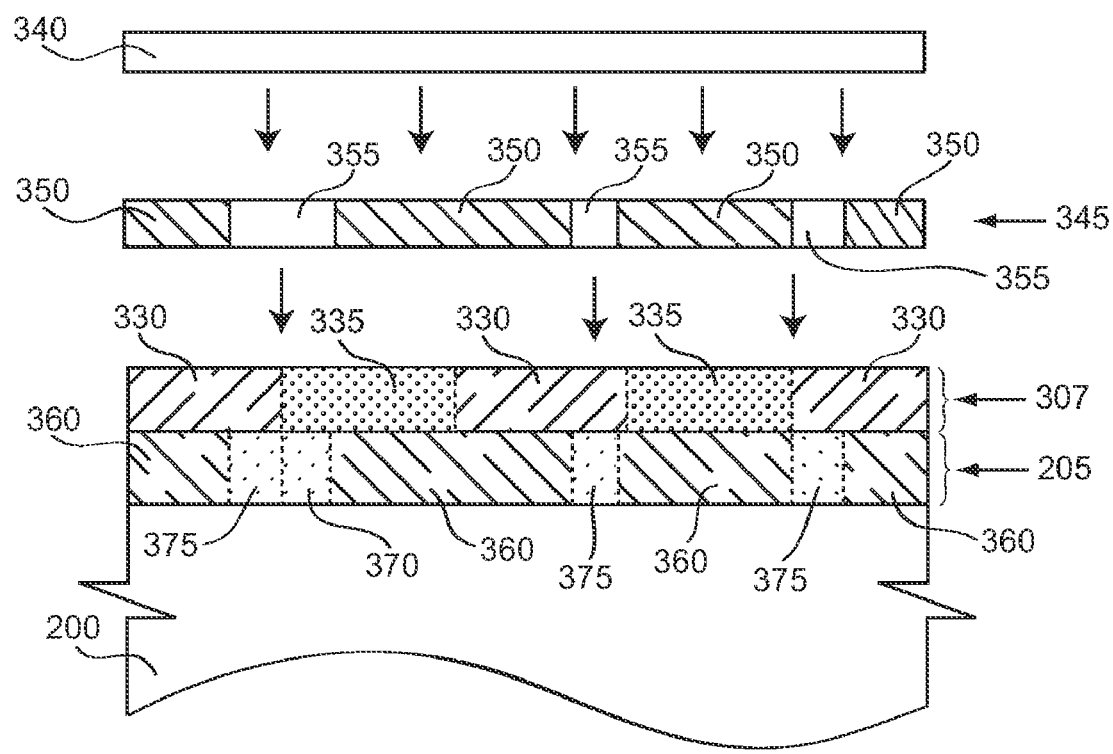
FIG. 4C is an illustration of exposing the second layer and the first layer of FIG. 4B to a second dose of the radiation, in accordance with embodiments of the present invention.

FIG. 4C is an illustration of exposing the second layer 307 and the first layer 205 of FIG. 4B to a second dose of the radiation through a second mask 345 after thermally treating. The second mask 345 may have a pattern of masked sections 350 which are essentially opaque to the radiation or impenetrable to the energetic particles, and unmasked sections 355 which are essentially transparent to the radiation or penetrable to the energetic particles. The radiation may pass through the exposed at least one region 335 of the second layer resulting in exposing a first region 370 of the first layer 205, directly beneath the exposed at least one region 335 of the second layer 307, to a first fraction of the second dose of radiation. The radiation dose is reduced due to a partial absorbance of the radiation by the exposed at least one region 335 of the second layer 307, thus a first fraction of the second dose reaches the first region 370 of the first layer 205. The radiation may pass through at least one area 330 of the second layer 307 which was not previously exposed during the patternwise imaging illustrated in FIG. 4B, resulting in exposing a second region 375 of the first layer 205 directly beneath the at least one area 330 of the second layer 307 to a second fraction of the second dose of the radiation. The radiation dose is reduced due to a partial absorbance of the radiation by the at least one area 330 of the second layer 307, thus a second fraction of the second dose reaches the second region 375 of the first layer 205. Exposing the second layer 307 and the first layer 205 to a second dose of the radiation, results in the first photosensitive acid generator producing acid in the first region 370 and in the second region 375 of the first layer 205. Since the exposed at least one region 335 of the second layer 307 has a reduced absorbance due to acid-catalyzed bond cleavage of the acid-cleavable absorbing moieties, the first fraction of radiation exposing the first region 370 of the first layer 205 is higher than the fraction of radiation exposing the second region 375 of the first layer 205.

Figure 4D:
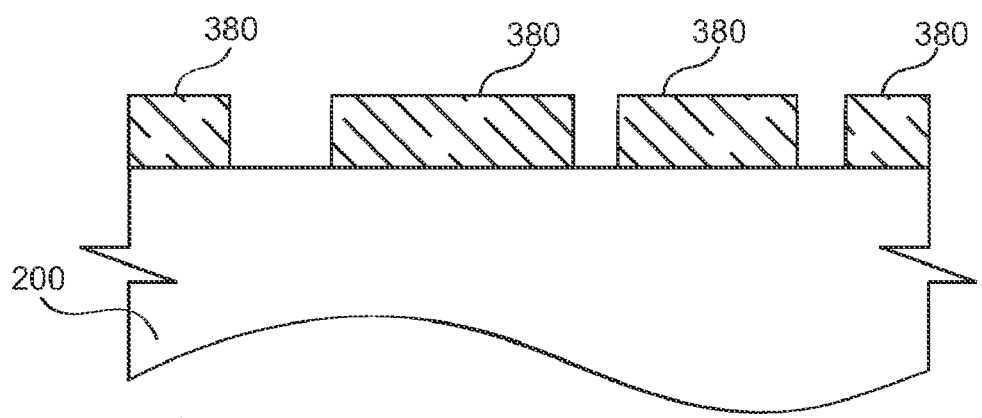
FIG. 4D is an illustration of the layers and substrate of FIG. 4C after removing the second layer and base-soluble regions of the first layer, in accordance with embodiments of the present invention.

FIG. 4D is an illustration of the layers and substrate of FIG. 4C after removing the second layer 307 and base-soluble regions (370 and 375) of the first layer 205, wherein a relief pattern 380 from the first layer 205 remains following the removing. The relief pattern 380 may comprise unexposed regions 360 of the first layer 205 remaining after the removing. Removing the second layer 307 of the FIG. 4C and the base-soluble regions 375 and 370 of the first layer 205 of FIG. 4C may comprise developing the second layer 207 and base-soluble portions of the first layer 360 in an aqueous base solution, where the second layer 207 and base-soluble portions of the first layer 360 are dissolved in the aqueous base developer. Base-soluble regions of the first layer may comprise the exposed at least one region 375 and 370 of the first layer 205 as shown in the example of FIG. 4C. In other embodiments, such as where the first photoresist is a negative tone resist, base-soluble regions may comprise unexposed regions 360 of the first layer 205, which may be removed following exposure to radiation.

The relief patterns described herein may be transferred to the substrate. If the substrate comprises an antireflective coating (ARC) and/or planarizing underlayer onto which the photoresist film has been formed, the ARC and/or planarizing underlayer may be removed at the gaps in the patterned photoresist layer to expose portions of the substrate. For example, the antireflective coating and/or planarizing underlayer may be removed by etching. Once the desired portions of the substrate are exposed, the relief pattern (e.g. the pattern of gaps between remaining portions after developing) may be transferred to portions of the substrate. Transferring the pattern may comprise, for example, etching, such as reactive ion etching (RIE), depositing (such as vapor deposition or electroplating) a material (such as a dielectric, a metal, a ceramic or a semiconductor) onto the substrate in a gap in the exposed photoresist film, by implanting dopants into the substrate material in a gap in the exposed photoresist film, or by a combination of one or more of these methods.

EXAMPLE 1

Synthesis of methoxycyclohexene protected copolymer of 4-hydroxystyrene and 2-{[5-(1',1',1'-trifluoro-2'-trifluoromethyl-2'-hydroxy)propyl]-norbornyl]}methacrylate (PVPNBHFA-MOCH)

To a round bottom flask equipped with condenser, thermometer, an argon (Ar) inlet, and a magnetic stirrer bar, the following were added: 4-acetoxystyrene monomer (10.8 grams (g), 0.03 mole), 2-{[5-(1',1',1'-trifluoro-2'-trifluoromethyl-2'-hydroxy)propyl]-norbornyl]}methacrylate monomer (3.24 g, 0.02 mole), 2,2'-azobis(2methylpropionitrile) (AIBN)(0.492 g, 6% of total moles of monomers), and approximately 55 g of tetrahydrofuran (THF). The reaction mixture was stirred at room temperature and bubbled with Ar flow for 45 minutes before it was heated. The reaction was carried out overnight at 70° C. under an inert Ar atmosphere. The reaction solution was then cooled to room temperature and approximately 22 g of THF was blown away by a high flow of nitrogen bubbling into the flask. To the remaining reaction solution, 25 g of methanol and 7 g of concentrated $NH_4OH$ were added and the reaction was carried out at 65° C. overnight. The solution was then cooled to room temperature and added dropwise into a mixture of water (1000 milliliters (ml)). The precipitated polymer was separated, rinsed with water (2×300 ml) and dried in a vacuum oven at 65° C. for a short time. The polymer was re-dissolved in acetone and re-precipitated in a mixture of water (1000 ml) and glacial acetic acid (30 ml). The solid was filtered with a frit funnel, washed with water (2×300 ml) and dried in a vacuum oven at 65° C. for 24 hours. The final weight of the polymer was 12.2 g.

A 3 weight % (wt %) polymer solution was prepared by dissolving 300 milligrams (mg) of the above obtained polymer in 10 g of PGMEA. The solution was spin-coated onto a one inch silicon wafer and baked at 100° C. for 60 seconds (s). The n and k values were measured with a VB-250 VASE Ellipsometer manufactured by J.A. Woollam Co. Inc., where the polymer had an n value of 1.601 and a k value of 0.269.

5 g of the above obtained polymer was dissolved with 25 g of PGMEA solution in a round bottom flask, approximately 11 g of the PGMEA solvent was then removed with a high nitrogen flow. The polymer solution was added with approximately 30 mg of oxalic acid. After the acid was dissolved, 6 g (excess) of 1-methoxycyclohexene was added to the solution, and the reaction was carried out at room temperature with stirring overnight. The reaction was then quenched with 4.5 g of basic active aluminum oxide. The quenched solution was filtered through 0.2 micron (μ) filter into a 120 ml glass bottle. Approximately 80 g of hexane was added to the solution, and the glass bottle with its cap tightly closed was shaken vigorously to form a coagulated polymer on the bottom of the bottle. The solvents were decanted. This coagulated polymer was washed with hexane using the same procedure three more times. The solid was then dried in a vacuum oven at approximately 45° C. for 24 hours.

EXAMPLE 2

Formulation of PVPNBHFA-MOCH photoresist (IML-8)

A photoresist formulation was obtained by mixing PVPN-BHFA-MOCH (from Example 1) with 0.46 wt % (relative to the polymer) 1,8-bis(dimethylamino)naphthalene (PROTON SPONGE) and 5.6 wt % triphenylsulfonium perfluorobutanesulfonate (TPS PFBUS) and 200-1000 ppm of the fluorinated aliphatic polyester surfactant FLUORAD FC-430 (available from 3M Company), in 4-methyl-2-pentanol. The total solid weight content in the solution was about 3%.

EXAMPLE 3

Synthesis of 2-benzyloxy-1-propene protected terpolymer of 2-hydroxyethyl methacrylate, 1,1,1-trifluoro-2-trifluoromethyl-2-hydroxy-4-pentyl methacrylate and 2-trifluoromethanesulfonylaminoethyl methacrylate (HEMA-IPHFA-STAR-BOP)

To a round bottom flask equipped with condenser, thermometer, an argon inlet and a magnetic stirrer bar, the following were added: 2-hydroxyethyl methacrylate monomer (2.928 g, 0.0225 mole), 1,1,1-trifluoro-2-trifluoromethyl-2-hydroxy-4-pentyl methacrylate monomer (5.88 g, 0.02 mole), 2-trifluoromethanesulfonylaminoethyl methacrylate monomer (1.958 g, 0.0075 mole), AIBN (0.41 g, 5% of total moles of monomers), and approximately 50 g of THF. The reaction mixture was stirred at room temperature and bubbled with Ar flow for 45 minutes before it was heated. The reaction was carried out overnight at 70° C. under an inert argon atmosphere. Then the reaction solution was cooled to room temperature and precipitated in hexane. The solid was collected and dried in vacuum oven at 60° C. overnight.

3 g of the above obtained polymer was dissolved with 17 g of PGMEA solution in a round bottom flask. The polymer solution was added with approximately 20 mg of oxalic acid. After the acid was dissolved, 1.07 g of 2-benzyloxy-1-propene was added to the solution, and the reaction was carried out at room temperature with stirring overnight. The reaction was then quenched with 3.5 g of basic active aluminum oxide. The quenched solution was filtered through 0.2µ filter into a 120 ml glass bottle. Approximately 80 g of hexane was added to the solution, and the glass bottle with its cap tightly closed was shaken vigorously to form a coagulated polymer on the bottom of the bottle. The solvents were decanted. This coagulated polymer was washed with hexane using the same procedure three more times. The solid was then dried in a vacuum oven at approximately 45° C. for 24 hours.

EXAMPLE 4

Formulation of HEMA-IPHFA-STAR-BOP photoresist layer (TBL-7)

A HEMA-IPHFA-STAR-BOP photoresist formulation (TBL-7) was obtained by mixing HEMA-IPHFA-STAR-BOP (from Example 3) with 0.46 wt. % (relative to the polymer) 1,8-bis(dimethylamino)naphthalene (PROTON SPONGE) 5.6 wt. % triphenylsulfonium perfluorobutanesulfonate (TPS PFBUS) and 200-1000 ppm of the fluorinated aliphatic polyester surfactant FLUORAD FC-430 (available from 3M Company), in 4-methyl-2-pentanol. The total solid weight content in the solution was about 3%.

EXAMPLE 5

Exposure test of TBL-7

The TBL-7 solution (from Example 4) was spin-coated onto a 5 inch silicon wafer and baked at 100° C. for 60 s; then n and k values were measured with a VB-250 VASE ellipsometer manufactured by J.A. Woollam Co. Inc. An n value of 1.655 and a k value of 0.127 were obtained on the coated TBL-7 film. The TBL-7 coated wafer was then flood exposed with broad band UV light. After the exposure, the wafer was baked at 100° C. for 60 s, then the n and k values were measured with the ellipsometer again, where an n value of 1.590 and a k value of 0.0266 were obtained.

EXAMPLE 6

Lithographic studies with IML-8

An argon fluoride (ArF) resist, AR1570 (from Japan Synthetic Rubber Co.) was spin coated onto a 12 inch silicon wafer which had an approximately 42 nanometer (nm) thickness coating of Rohm & Haas bottom anti-reflective coating (BARC) named AR40A. The resist was post-applying baked (PAB) at about 130° C. for about 60 seconds. Then the grey resist (IML-8) was spin coated on top of ArF resist coated wafer, post-applying baked (PAB) at about 100° C. for about 60 seconds. The wafer was exposed to 193 nm wavelength light on an ASML stepper (0.93 NA, 0.9 outer and 0.6 inner G annular illumination), with first reticle, at a dose between 4.0 and 8.0 millijoules/centimeter$^2$ (mj/cm$^2$). The wafer was then post-exposure baked (PEB) at about 90° C. for about 60 seconds. The film was then developed using a single puddle develop process for about 30 seconds with 0.263 N TMAH developer (Moses Lake's AD-10). The wafer was again exposed to 193 nm wavelength light on an ASML stepper (0.93 NA, 0.8 outer and 0.53 inner σ Quasar 30 illumination), with second reticle, at a dose between 28 and 35 mj/cm$^2$. The wafer was then post-exposure baked (PEB) at about 125° C. for about 60 seconds. The film was then developed using a single puddle develop process for about 30 seconds with 0.263 N TMAH developer (Moses Lake's AD-10). The images of the ArF resist had less corner rounding, and less line end shortening. For PC (polysilicon conductor, used for gates) level application, the tip to tip distance has been significantly reduced.

EXAMPLE 7

Lithographic studies with TBL-7

An ArF resist, AR1570 (from Japan synthetic Rubber Co.) was spin coated onto a 12 inch silicon wafer which had an approximately 42 nm thickness coating of Rohm & Haas bottom anti-reflective coating (BARC) named AR40A. The resist was post-applying baked (PAB) at about 130° C. for about 60 seconds. Then the bleachable resist (TBL-7) was spin coated on top of ArF resist coated wafer, post-applying baked (PAB) at about 90° C. for about 60 seconds. The wafer was exposed to 193 nm wavelength light on an ASML stepper (0.93 NA, 0.9 outer and 0.6 inner σannular illumination), with first reticle, at a dose between 4.0 and 8.0 mj/cm². The wafer was then post-exposure baked (PEB) at about 100° C. for about 60 seconds. The wafer was again exposed to 193 nm wavelength light on an ASML stepper (0.93 NA, 0.8 outer and 0.53 inner σ, Quasar 30 illumination), with second reticle, at a dose between 20 and 28 mj/cm². The wafer was then post-exposure baked (PEB) at about 125° C. for about 60 seconds. The film was then developed using a single puddle develop process for about 30 seconds with 0.263 N TMAH developer (Moses Lake's AD-10). The images of the ARF resist had less corner rounding, and less line end shortening. For PC application, the tip to tip distance has been significantly reduced.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:

1. A photolithography method comprising:
    forming a first layer of a first photoresist on a substrate, said first photoresist comprising a first polymer and a first photosensitive acid generator, said first photosensitive acid generator producing acid upon exposure to radiation having a wavelength or range of wavelengths;
    forming a second layer of a second photoresist directly onto said first layer, said second photoresist comprising a second polymer and a second photosensitive acid generator, said second photosensitive acid generator producing acid upon exposure to said radiation, said second polymer comprising an absorbing moiety resulting in said second polymer absorbing said radiation;
    patternwise imaging said second layer through a first mask, resulting in exposing at least one region of said second layer to a first dose of said radiation, resulting in said second photosensitive acid generator producing acid in said exposed at least one region of said second layer;
    developing said second layer in an aqueous base solution, resulting in removal of base-soluble regions of said second layer, wherein a first relief pattern from said second layer remains following said removal;
    exposing said first relief pattern and said first layer to a second dose of said radiation through a second mask, resulting in exposing at least one region of said first relief pattern to said second dose of radiation, said polymer in said first relief pattern absorbing a portion of said second dose of radiation, resulting in a fraction of said second dose of radiation passing through said at least one region of said first relief pattern and exposing at least one region of said first layer to said fraction of said second dose of radiation, resulting in said first photosensitive acid generator producing acid in said exposed at least one region of said first layer; and
    removing said first relief pattern and base-soluble regions of said first layer, wherein a second relief pattern from said first layer remains following said removing.

2. The method of claim 1, said method further comprising:
    after said imaging and before said developing, baking said second layer at a first temperature, resulting in said exposed at least one region of said second layer becoming substantially soluble in aqueous base.

3. The method of claim 2, said method further comprising:
    after said exposing and before said removing, baking said first layer and said first relief pattern at a second temperature, resulting in said exposed at least one region of said first layer and said first relief image becoming substantially soluble in aqueous base.

4. The method of claim 3, wherein said removing comprises developing in aqueous base, wherein said relief pattern and said exposed at least one region of said first layer are dissolved in said aqueous base.

5. The method of claim 4, wherein said second temperature is higher than said first temperature, wherein said first temperature and said second temperature are each in a range from about 70° C. to about 140° C.

6. The method of claim 1, wherein said first dose of said radiation is lower than said second dose of said radiation.

7. The method of claim 1, wherein said first dose is in a range from about 1 millijoules/centimeter² to about 10 millijoules/centimeter², and said second dose is in a range from about 12 millijoules/centimeter² to about 80 millijoules/centimeter².

8. The method of claim 1, wherein said second mask and said first mask are different.

9. The method of claim 1, wherein said fraction of said second dose of radiation is between about 0.15 and about 0.90.

10. The method of claim 1, wherein said absorbing moiety is selected from the group consisting of unsubstituted aromatic moieties and substituted aromatic moieties.

11. The method of claim 1, wherein said absorbing moiety is selected from the group consisting of benzene, naphthalene, hydroxy-substituted benzene, and hydroxy-substituted naphthalene.

12. The method of claim 1, wherein said second polymer comprises:

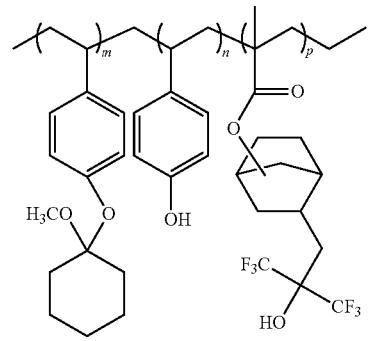

where m, n, and p are integers each independently ranging between 1 and about 50,000.

13. A photolithography method comprising:
    forming a first layer of a first photoresist on a substrate, said first photoresist comprising a first polymer and a first photosensitive acid generator, said first photosensitive acid generator producing acid upon exposure to radiation having a wavelength or range of wavelengths;
    forming a second layer of a second photoresist directly onto said first layer, said second photoresist comprising a second polymer and a second photosensitive acid generator, said second polymer comprising at least one absorbing moiety, each absorbing moiety absorbing radiation having said wavelength or range of wavelengths, said absorbing moiety cleavable from said polymer upon thermal treatment in the presence of acid, said second photosensitive acid generator producing acid upon exposure to said radiation;

patternwise imaging said second layer through a first mask, resulting in exposing at least one region of said second layer to a first dose of said radiation, resulting in said second photosensitive acid generator producing acid in said exposed at least one region of said second layer, wherein at least one area of said second layer is not exposed to said first dose of said radiation;

after said imaging, thermally treating said second layer at a first temperature, resulting in cleaving absorbing moieties from said polymer in said exposed at least one region of said second layer;

after said thermally treating, exposing said second layer and said first layer to a second dose of said radiation through a second mask, said radiation passing through said exposed at least one region of said second layer resulting in exposing a first region of said first layer directly beneath said exposed at least one region of said second layer to a first fraction of said second dose of radiation, said radiation passing through said at least one area of said second layer resulting in exposing a second region of said first layer directly beneath said at least one area of said second layer to a second fraction of said second dose of said radiation, resulting in said first photosensitive acid generator producing acid in said first region of said first layer and in said second region of said first layer; and removing said second layer and base-soluble regions of said first layer, wherein a relief pattern from said first layer remains following said removing.

14. The method of claim 13, wherein said base-soluble regions of said first layer comprise said first and second regions of said first layer.

15. The method of claim 13, wherein said base-soluble regions of said first layer comprise unexposed regions of said first layer.

16. The method of claim 13, wherein said first fraction is greater than said second fraction.

17. The method of claim 13, wherein said absorbing moiety is selected from the group consisting of unsubstituted aromatic moieties and substituted aromatic moieties.

18. The method of claim 17, wherein said absorbing moiety is selected from the group consisting of benzene, naphthalene, hydroxy-substituted benzene, and hydroxy-substituted naphthalene.

19. The method of claim 13, wherein said second polymer further comprises at least one base-soluble moiety selected from the group consisting of alcohols, fluoroalcohols, phenols, naphthols, sulfonamides, fluorosulfonamides, dicarboxyimides, N-hydroxy dicarboxyimides, carboxylic acids, amino groups and imino groups.

20. The method of claim 13, wherein said polymer comprises at least one repeating unit containing said absorbing moiety, said repeating unit comprising:

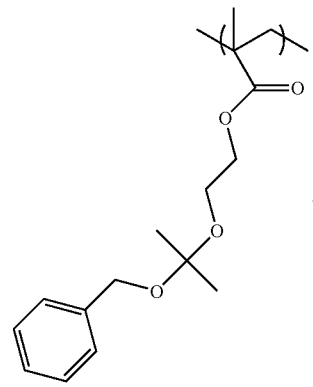

21. A photoresist composition, comprising:
at least one polymer having at least one absorbing moiety, said polymer substantially soluble in aqueous base developer, said absorbing moiety cleavable from said polymer upon thermal treatment in the presence of acid;
a photosensitive acid generator, said first photosensitive acid generator producing acid upon exposure to radiation having a wavelength or range of wavelengths; and
a solvent,
said polymer comprises at least one repeating unit containing said absorbing moiety, said repeating unit comprising:

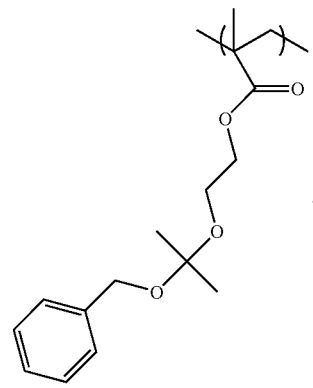

22. The photoresist composition of claim 21, wherein said absorbing moiety comprises unsubstituted aromatic moieties or substituted aromatic moieties.

23. The photoresist composition of claim 21, wherein said polymer further comprises at least one base-soluble moiety selected from the group consisting of alcohols, fluoroalcohols, phenols, naphthols, sulfonamides, fluorosulfonamides, dicarboxyimides, N-hydroxy dicarboxyimides, carboxylic acids, amino groups and imino groups.

* * * * *